(12) United States Patent
Baker

(10) Patent No.: US 12,237,812 B1
(45) Date of Patent: Feb. 25, 2025

(54) SEMI-LOG PREAMP WITH SWITCHED GAINS

(71) Applicant: Donald L Baker, Tulsa, OK (US)

(72) Inventor: Donald L Baker, Tulsa, OK (US)

( * ) Notice: Subject to any disclaimer, the term of this patent is extended or adjusted under 35 U.S.C. 154(b) by 0 days.

(21) Appl. No.: 18/957,798

(22) Filed: Nov. 24, 2024

(51) Int. Cl.
*H03F 3/45* (2006.01)
*H03F 1/02* (2006.01)

(52) U.S. Cl.
CPC ....... *H03F 1/0211* (2013.01); *H03F 3/45475* (2013.01); *H03F 2203/45116* (2013.01); *H03F 2203/45522* (2013.01)

(58) Field of Classification Search
CPC .................................... H03F 3/45; H03F 1/30
USPC ........................................ 330/260, 261, 297
See application file for complete search history.

(56) References Cited

U.S. PATENT DOCUMENTS

| | | |
|---|---|---|
| 9,401,134 B2 | 7/2016 | Baker |
| 10,217,450 B2 | 2/2019 | Baker |
| 10,380,986 B2 | 8/2019 | Baker |
| 10,810,987 B2 | 10/2020 | Baker |
| 11,011,146 B2 | 5/2021 | Baker |
| 11,087,731 B2 | 8/2021 | Baker |

*Primary Examiner* — Henry Choe

(57) ABSTRACT

This invention is a linear preamp with switchable and variable gains, for several switched input signal circuits, so that the output of the preamp can compensates either for differences in the input signal amplitudes or for different desired signal levels for different inputs. The variation in gain control position or level produces a nearly log change in gain, to conform better to human hearing. The preamp does so with a minimum of low- or micro-power components, allowing run times of hundreds to thousands of hours on small battery packs.

13 Claims, 14 Drawing Sheets

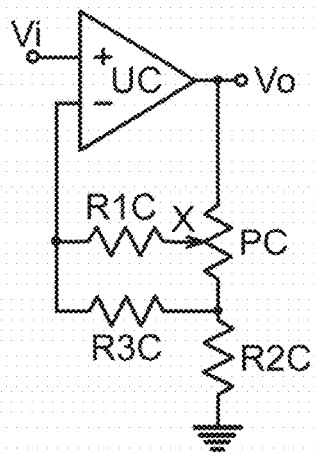
FIG. 13
FIG. 14
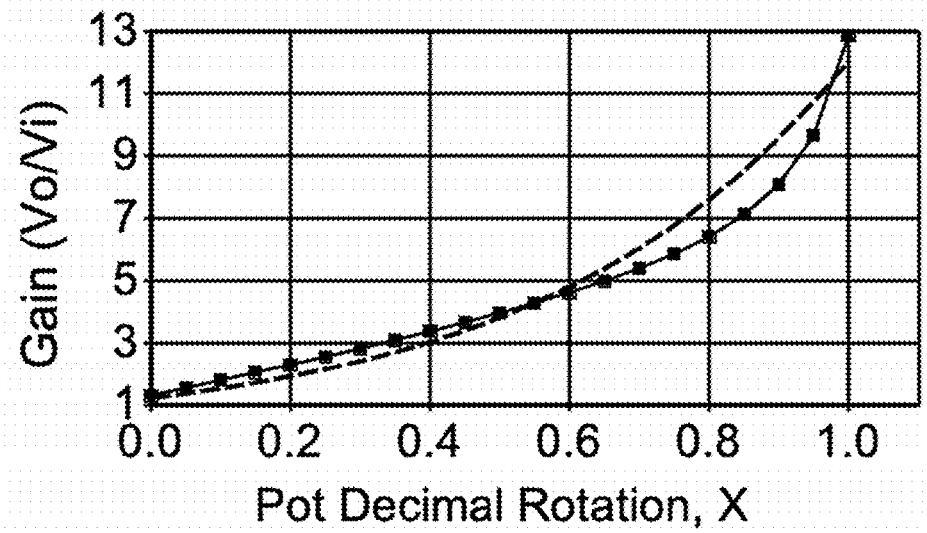
FIG. 15
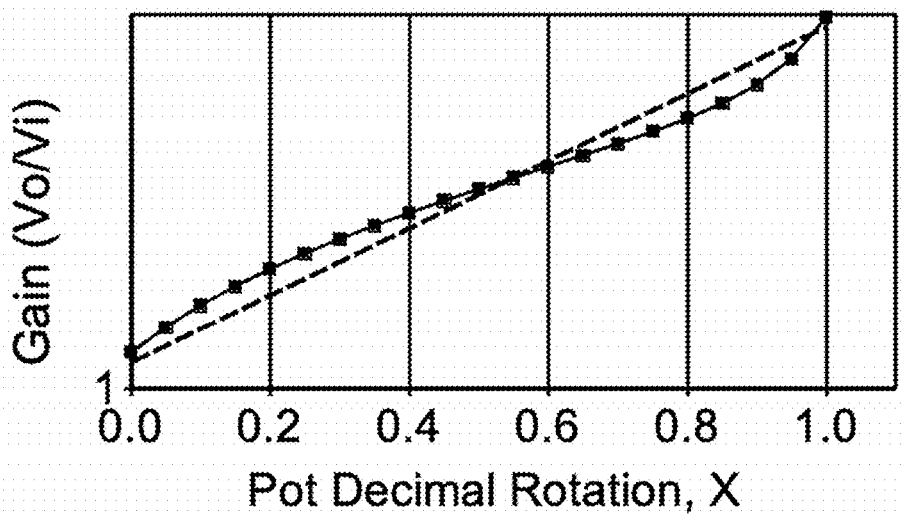

… … … … … … … … … … … … … … … … … … … … … … … … … …

SEMI-LOG PREAMP WITH SWITCHED GAINS

RELATED APPLICATIONS

This invention is related to, a continuation of, and/or improves on inventions previously disclosed in:
a. U.S. Pat. No. 9,401,134 B2 (Baker, 2016), FIG. 36;
b. U.S. Pat. No. 10,217,450 B2 (Baker, 2019), FIG. 17;
c. U.S. Pat. No. 10,380,986 B2 (Baker, 2019), FIG. 10, FIG. 17, and to a lesser extent, FIGS. 11 & 13; and
d. U.S. Pat. No. 10,810,987 B2 (Baker, 2020), FIG. 16
e. U.S. Pat. No. 11,011,146 B2 (Baker, 2021), FIG. 9
f. U.S. Pat. No. 11,087,731 B2 (Baker, 2021), FIG. 21

PRIOR ART

The independent research for this particular invention did not find other prior art beyond manufacturer's component notes and publications either needful or helpful. And the currently available search tools, such as patents.google.com, have either provided such an overwhelming deluge of irrelevant results as to be useless, or have been so limited or complicated to use as to be likewise unhelpful. We need a better system to do patent searches, which any engineer can use, without extensive training in its idiosyncrasies. We need a patent search system which all Engineering Schools would find useful to teach. Preferably something which uses AI to search not only existing patents, but all engineering journal articles, manufacturers' application notes, manuals and specification sheets, as well as web pages, theses, dissertations and even magazine articles.

Just don't give the contract to SkyNet.

Despite what scientific peer reviewers may say, it is not humanly possible to be cognizant of what could be thousands to millions of existing documents in any particular subject or field. For example, it was a long time ago, but if I remember correctly, I put one of my published papers, A second-order diagonally-implicit Runge Kutta (DIRK) time stepping method, Baker, Donald L., Groundwater, Vol. 31-6, November 1993, p 890-895, into my 1994 PhD Dissertation at Colorado State University at Fort Collins. Again, if I remember correctly, I demonstrated by common stability analysis that of all the second-order DIRK methods, the Crank-Nicolson (C-N) implicit-in-time method is the most likely to be unstable and/or inaccurate and/or time-consuming. Yet the C-N method is the one most taught in grad schools, because it is one of the easiest to understand and implement. But even though I found up to 4.7 times improvement in accuracy, and up to an order of magnitude improvement in computer efficiency with other second-order DIRK methods, my paper must be terribly obscure. Because to this day it is rarely if ever cited, and people are still touting the C-N method in their papers.

So here's the question—if my contribution 31 years ago had ever been patent-eligible, or even patent-relatable as prior art, how could anyone ever find it among all the thousands of other papers on the subject? It's lost in the noise.

BACKGROUND OF THE INVENTION

A Need for Improvement

A breadboard preamplifier, similar to the circuit in FIG. 16 of U.S. Pat. No. 10,810,987, was built for a prototype guitar. It used a single dual opamp IC chip and a battery power source of three AA cells. One of the opamps, called second in the Claims, reprises the power voltage splitter in the U5 circuit in FIG. 36 of U.S. Pat. No. 9,401,134, driving a ground reference. That circuit was inspired by a similar circuit which equalized plus and minus current battery supply drains in a commercial underwater electrical conductivity and temperature sensor used in the 1970s at the Virginia Institute of Marine Science. It minimized ground loop potentials in the DC voltage signals coming back up the cable from the instrument package. I have not been able to find any reference to give it credit as prior art.

The other opamp on the chip, called first in the Claims, drives a preamp circuit similar to the 12-way switching preamp in FIG. 16 in U.S. Pat. No. 10,810,987. In its building, the feedback/gain resistors switched out by hand on a plastic plugboard to try to equalized the guitar outputs for each of the 12 possible pickup circuits. That part didn't work so well, being inconvenient to easily adjust.

Technical Problems to be Solved

This invention has several basic objectives:
a. A feedback circuit for the first of the dual opamps on an integrated circuit (IC) chip, which has one or more small, square, multi-turn trimmer potentiometers (pots) for setting gain, or a single digital pot, which
   i. will operate over a gain range on the order of 1.1 to 11, to 1.5 to 15, 1.2 to 12 being preferable.
   ii. for two or more pots, wherein each pot can be switched into and out of the feedback circuit with just one pole of a multi-pole pot selection switch, the other poles of which switch may also be used to switch guitar pickup circuits;
   iii. can operate with all the other unused pots still partially in the circuit;
   iv. has a gain characteristic which is linear for the signal at any particular gain set by the active pot;
   v. has a gain characteristic which is nearly logarithmic versus the linear gain pot adjustment, meaning having a nearly straight line in a semi-log taper plot; and
   vi. the feedback is based on the opamp output and negative input, so that the input signal can be connected to the high-impedance positive opamp input, with can be used with an optional high-resistance (1 Megohm or greater) grounding resistor.
b. A micro-power circuit which uses 2 to 4 AA batteries, depending on needs and battery chemistry, with a quiescent supply current of less than a milliamp, using a second of the dual opamps on a single IC chip, as has been done in related art.
c. The circuit has a minimal number of components, especially in the feedback circuit of the first opamp, where only the feedback pots are switched and none of the feedback resistors are switched.
d. The circuit can fit on a printed circuit board (PCB) on the order of 1.5 by 2 inches or less, depending on whether through-hole or surface-mount components or both are used.
e. The PCB has connectors to the rest of the guitar, preferably header pins, for power and switching.
f. The PCB can be switched in and out of the guitar signal path, like a guitar pedal board circuit, between the pickup switching and the output, with the power disconnected when it is out of the path.

g. The PCB power can also be disconnected when the guitar output cable plug is pulled out of the guitar output jack, as was done in related art.

SUMMARY OF THE INVENTION

This invention comprises of a battery-powered micropower integrated circuit (IC) preamp, mounted inside an electric guitar, in which one or more adjustment pots change the gain for one or more switched pickup circuits, using one pole of a multi-pole pickup switch. It allows the output amplitudes of the different pickup circuits to be equalized, especially in the case of different phase cancellations between the pickups in the different switched pickup circuits. It has a gain characteristic which is linear for the pickup signals, but nearly logarithmic with the setting of each adjustment pot, with a gain range on the order of about 1.2 to 12, with other ranges possible. It has a bypass switch which both takes it out of the signal path and switches off the power supply, and a power supply disconnect when the guitar output plug is removed from the output jack.

BRIEF DESCRIPTION OF DRAWINGS

FIG. 13—A third embodiment, basic opamp circuit C, an ideal opamp, a pot, PC, and 3 resistors, R1C, R2C and R3C, producing a non-linear gain change with pot rotation, closer to ideal that circuit B, where R1C has been removed from the position of R1B and placed between the minus opamp input and the wiper of pot PC.

FIG. 14—The output gain curve of circuit C, gain versus pot rotation, as a solid line with data points on a linear-linear plot, with the Ideal log gain plot as a dashed line, where the values of resistors R1C, R2C and R3C have been optimized with a 100 k pot to produce a closer fit than circuit B of the opamp gain curve to the ideal gain curve.

FIG. 15—The output gain curve in FIG. 14, plotted on a semi-log graph.

DETAILED DESCRIPTION OF THE INVENTION

Related Art

Figure 1:
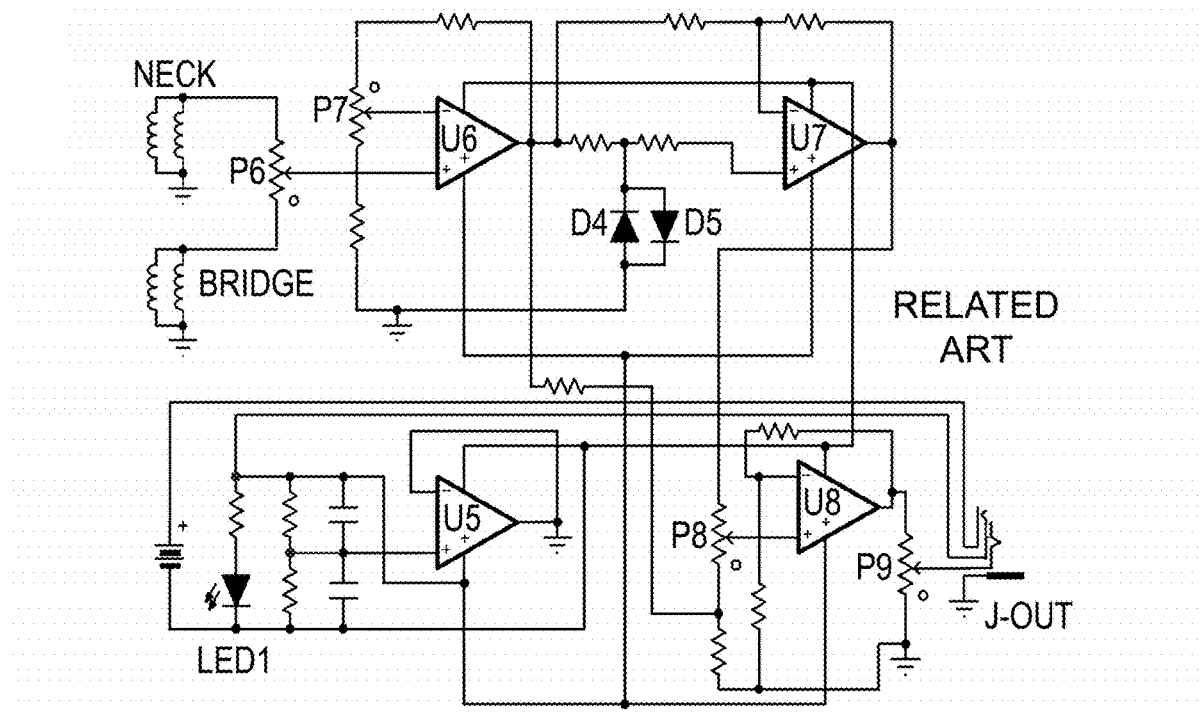
FIG. 1—Related Art, FIG. 36 from U.S. Pat. No. 9,401, 134 (Baker, 2016), showing a circuit about U5 which evenly splits a battery voltage about the system ground.

FIG. 1 shows related art, FIG. 36 from U.S. Pat. No. 9,401,134 (Baker, 2016). It corrects a couple of connection errors in the original Figure. The power supply circuit, using opamp U5, has an unlabeled multi-cell battery, driving an indicator LED, and a resistive voltage divider with filter capacitor, with the center of the divider driving the plus input of opamp U5. Opamp U5 has a voltage-follower, gain of 1 feedback circuit and drives the circuit ground. This splits the battery supply outputs evenly across the circuit ground. Note that battery supply is disconnected from the circuit when the guitar cable plug is removed from jack J-OUT. This is the kind of battery power supply used here, which is modified by a bypass switch (shown later) which in a first state will supply power to the disclosed circuit, as well as place it in the signal path between the pickup switching circuit and the guitar volume control. The second state of the bypass switch will disconnect the battery from the circuit on at least on terminal, and connect the pickup switching circuit directly to the guitar volume control, removing the disclosed preamp from the circuit. This kind of bypass is commonly used in guitar distortion pedals.

Figure 2:
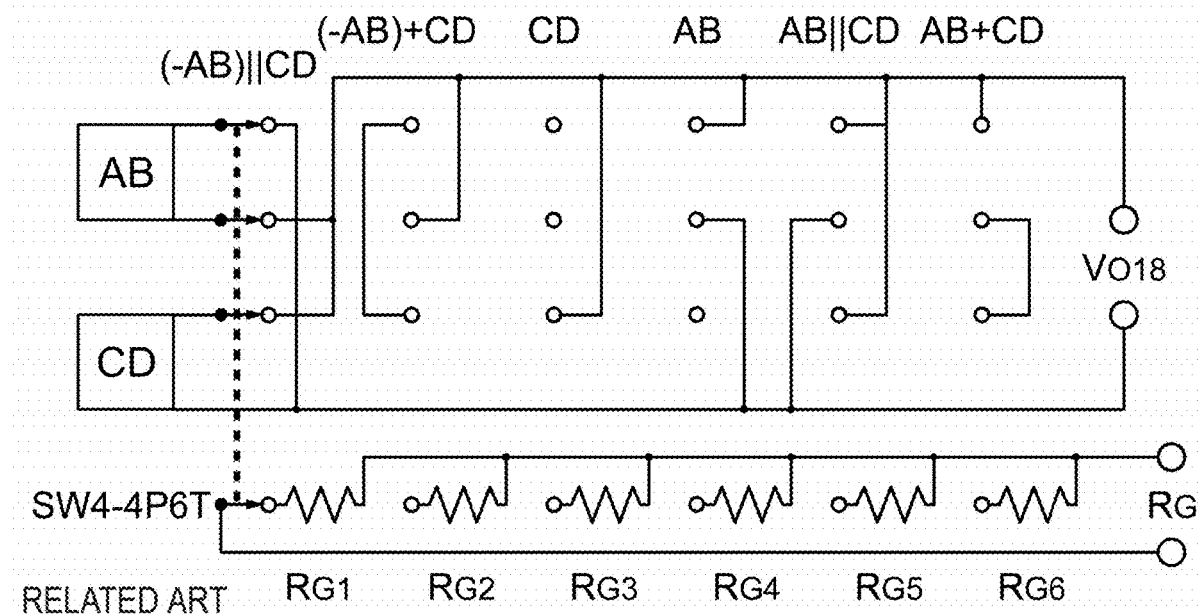
FIG. 2—Related art, FIG. 17 from U.S. Pat. No. 10,217, 450 (Baker, 2019), showing how one pole of a multi-pole pickup switching circuit can be used to switch gain resistors for an onboard preamplifier.
Figure 3:
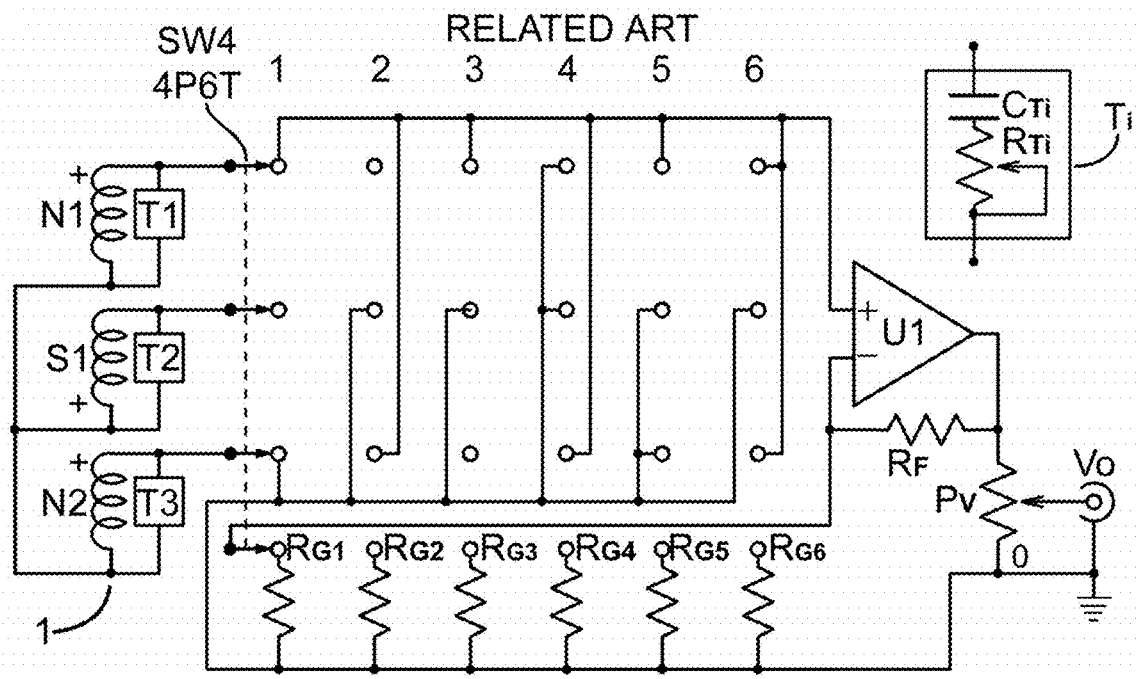
FIG. 3—Related art, FIG. 10 from U.S. Pat. No. 10,380, 986 (Baker, 2019), showing a variation of the circuit in FIG. 2, for switching preamp gain for each pickup circuit.
Figure 4:
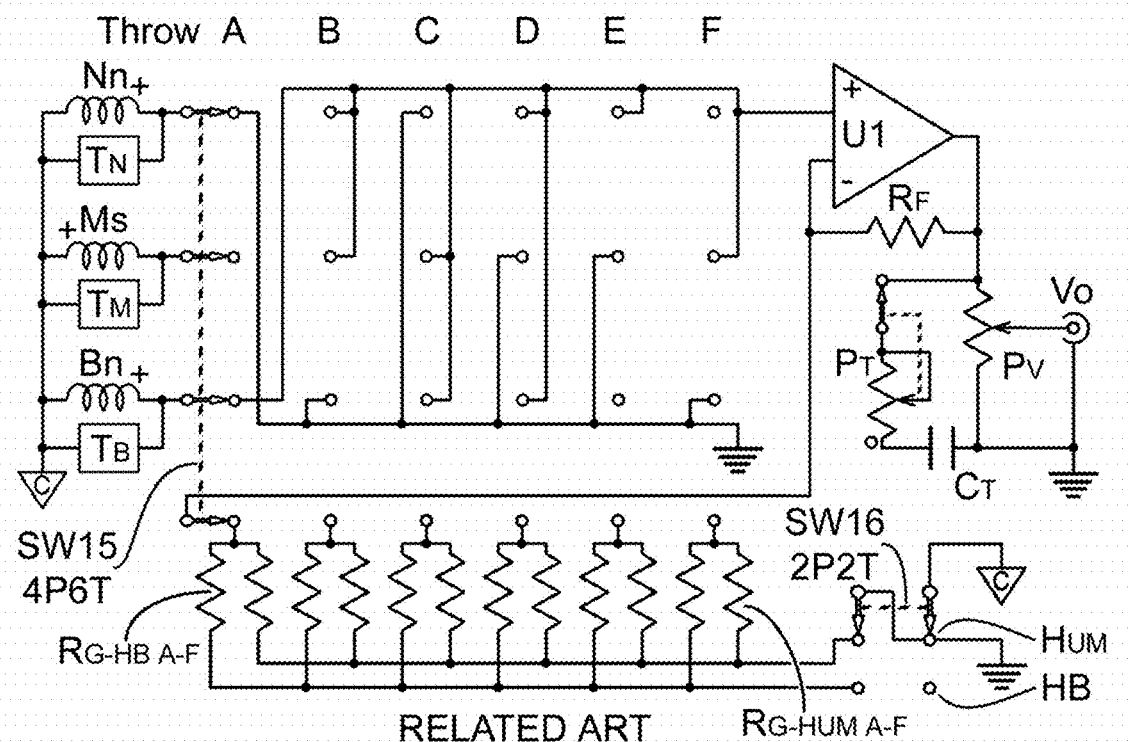
FIG. 4—Related art, FIG. 16 from U.S. Pat. No. 10,810, 987 (Baker, 2020), showing another variation on the theme of using one pole of a pickup switch to vary the preamp gains for each pickup circuit, but with a mode switch for twice as many circuits.
Figure 16:
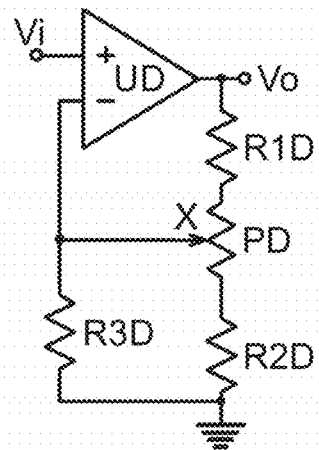
FIG. 16—A fourth embodiment, basic opamp circuit D, an ideal opamp, a pot, PD, and 3 resistors, R1D, R2D and R3D, producing a non-linear gain change with pot rotation, closer to ideal that circuit C, where R3D has been added in Circuit A between the minus input of the opamp and ground.
Figure 17:
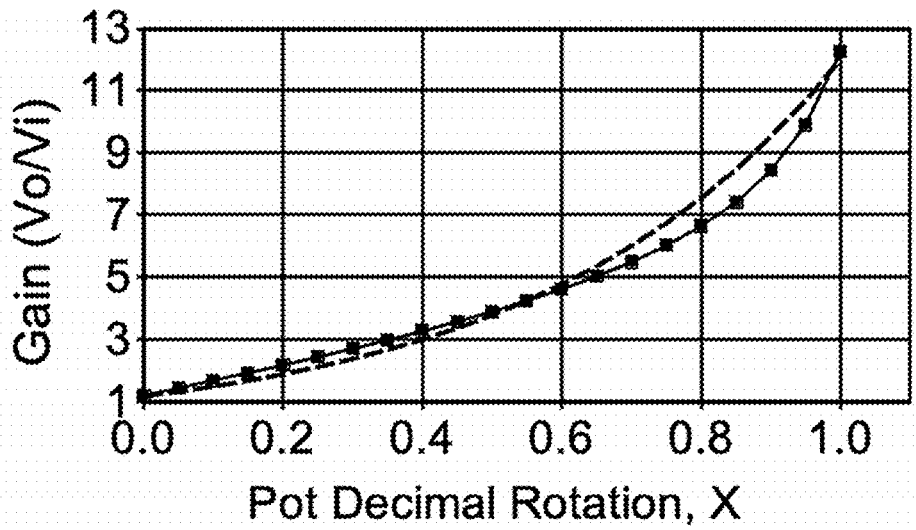
FIG. 17—The output gain curve of circuit D, gain versus pot rotation, as a solid line with data points on a linear-linear plot, with the Ideal log gain plot as a dashed line, where the values of resistors R1D, R2D and R3D have been optimized with a 100 k pot to produce a closer fit than circuit C of the opamp gain curve to the ideal gain curve.

FIG. 2 shows related art, FIG. 17 from U.S. Pat. No. 10,217,450 (Baker, 2019). One pole of a 4-pole pickup circuit switch is used to switch gain resistors for an associated preamp. FIG. 3 shows related art, FIG. 10 from U.S. Pat. No. 10,380,986 (Baker, 2019). Here the pickups and preamp from that Patent are shown, along with the switched gain resistors. FIG. 4. shows related art, FIG. 16 from U.S. Pat. No. 10,810,987 (Baker, 2020). Here again, a single pole from a pickup switch (SW15) changes out gain resistors in a preamp, but a 2-throw mode switch (SW16) also switches between two banks of gain resistors to produce a 12-way switching circuit, which has since been implemented in one prototype guitar (not shown) using three P-90 pickups. FIG. 4 also shows an output tone capacitor circuit (Pt,Ct) in parallel with the volume control (Pv).

Note that the pickup circuit output in FIGS. 1, 3 & 4 feed into the plus input of opamps U6, U1 and U1, respectively, and that the gain-setting feedback is based on the negative input. This is preferable, since when the plus opamp input is not part of the feedback, it can present a very high input impedance to the pickup signal, and not cause changes in timbre/tone. It may require a grounding resistor on the plus input to avoid DC drift or offset in the pickup signal, but this resistor can be 1 Megohm or higher. Otherwise, if the plus input is used In the gain-setting feedback circuit, then the pickup circuit see can a much lower preamp input imped-ance, which can affect the phase, bandwidth and amplitude of the pickup signal. This is less preferable.

A Logarithmic Gain Range of 1.2 to 12

For opamp circuits using the negative input alone in the feedback, the lowest gain always has to be 1 or more. One presumes here that a gain range ratio of 1 to 10 will be sufficient for the range of switched pickup circuit outputs that can be obtained from the inventions in U.S. Pat. Nos. 10,380,986, 10,810,987 and 11,011,146. The circuits with the most phase cancellations will have the lowest outputs. With a variable gain for each switched pickup circuit, the gains should all be set to the lowest gain. Then the gains for the lower outputs should be increased one by one to match the audible level of their outputs to the audible level of the pickup circuit with the highest output. Using more gain than that will simply cause one or more of the circuits to reach output clipping sooner as the battery supply voltage inevitably drops. If a gain range 1 to 10 turns out insufficient, that is easy to fix by changing resistors in the opamp feedback circuit. Since the lowest gain must be greater than or equal to 1, and too high a gain will mean clipping sooner as the power supply drops, let us choose a gain range of 1.2 to 12. That, too, can be easily changed.

Figure 5:
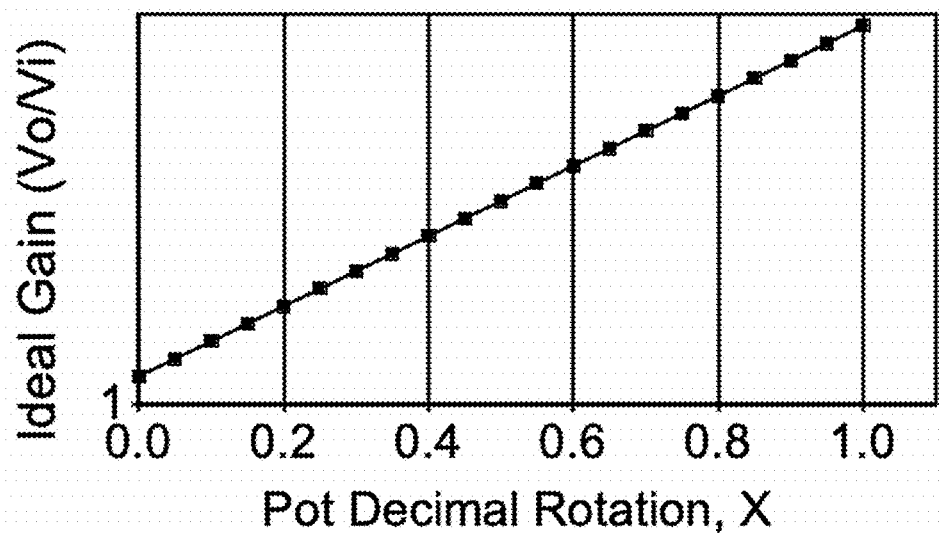
FIG. 5—Ideal log gain-setting plot for one pickup in a preamplifier, in log gain versus decimal rotation of the gain-setting potentiometer.
Figure 6:
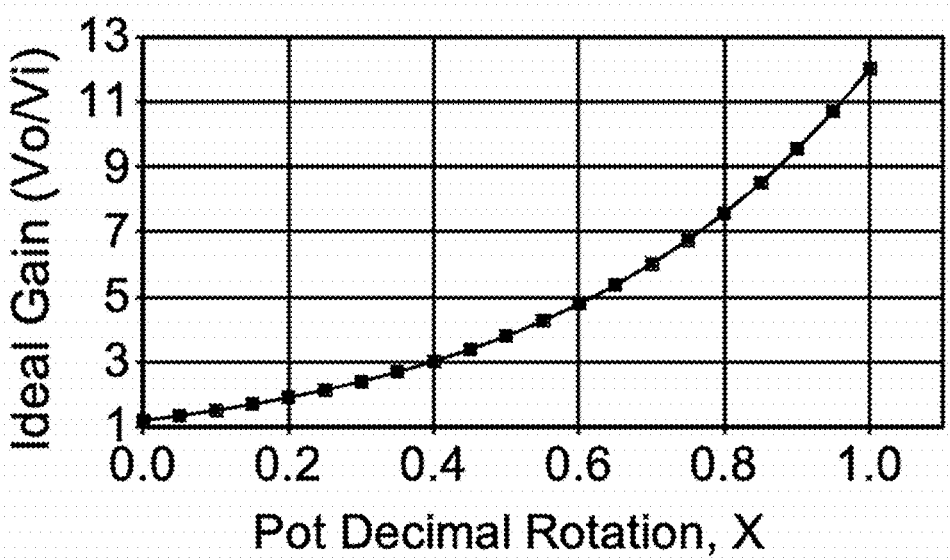
FIG. 6—The same ideal gain plot, in linear gain versus decimal pot rotation.

Basic Objective a.iv above calls for a gain characteristic that changes as the log of the pot rotation from 1.2 to 12. FIG. 5 shows this ideal gain curve, plotted as gain, Vinput or Vi over Voutput or Vo, on a log vertical scale on the left against the decimal pot rotation, x, where x goes from 0 to 1. FIG. 6 shows the same curve, but gain plotted on a linear vertical scale on the left. Note the subtle curve. The human ear responds to amplitude in a logarithmic fashion, so this kind of gain characteristic will sound like it changes the output amplitude evenly with pot rotation.

This inventor tried a larger number of opamp circuits to fit the basic objectives than those presented below. The circuits below are variations presented in order of increasing utility and preference.

Circuit A

Figure 7:
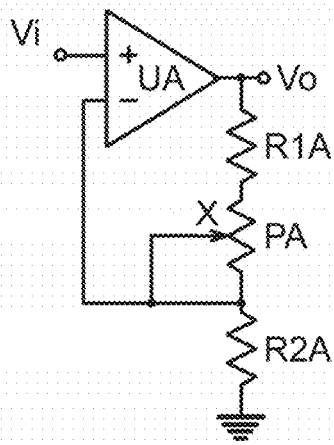
FIG. 7—A first embodiment, basic opamp circuit A, an ideal opamp, a pot, PA, and 2 resistors, R1A and R2A, producing a linear gain change with pot rotation.

Leaving out all the other circuits associated with this guitar preamp, the power supply, the pickup and mode switching, the tone and volume controls and the output, FIG. 7 shows Circuit A, the first embodiment, with one ideal opamp, a 100 k multi-turn pot, two resistors, and input, Vi, and an output, Vo. The input, Vi, is connected to the plus input of ideal opamp, UA, with an output, Vo. Vo and the negative input of UA are connected in a feedback circuit, using fixed resistor R1A, fixed resistor R2A and a potentiometer, PA. The X next to PA identifies the terminal where the pot wiper sits when it is turned full counter-clockwise, and also indicates the value of the decimal pot rotation. Math 1 shows the gain equation for this circuit, within the limits of output clipping. The signal gain, g, is changes linearly with pot setting, x.

$$g = \frac{Vo}{Vi} = 1 + \frac{R1A + x \cdot PA}{R2A} \qquad \text{Math 1}$$

If one solves Math 1 for g(x=0)=1.2 and g(x=1)=12, with PA=100 k, one gets R1A=1.852 k and R2A=9.259 k. But these are not standard commercial resistor values. One percent tolerance metal film resistors are cheap, about 10 cents each. So it behooves one to use 1% resistors. First, one choses a near 1% value for one resistor, and then uses a spreadsheet solver tool to get the rest. I chose R2A=9.53 k first. A spreadsheet for this circuit has four columns: x, g, ideal-g, and err. X is set up from 0 to 1 in steps of 0.05, in cells A8 to A28. The gain g is calculated from Math 1, in cells B8 to B28. Ideal_g is calculated from Math 2, in cells C8 to C28, and shown in FIGS. 5 & 6. Err is g minus ideal_g, in cells D8 to D28. The objective function is shown in Math 3, in terms of common spreadsheet functions.

$$\text{ideal\_g} = 1.2\left(\frac{12}{1.2}\right)^x \quad \text{Math 2}$$

Obj Funct=SUMSQ(D8:D28)+IF(MIN(B3:B4)<0,−1000*MIN(B3:B4),0)+100*(B28/B8−10)^2  Math 3:

When R2A=9.53 is picked, then the solver (in LibreOffice 7.6.6.3) changed R1A according to a "DEPS Evolutionary Algorithm", until the objective function in Math 3 reached a minimum value. The first term of the objective function is the sum of the squares of the error, err. The second term adds a penalty of 1000 times any negative value of R1A or R2A. The third term adds a penalty of 100 times any difference between the ratio of maximum and minimum gains of the circuit (at x=1 and x=0) and 10, pushing the gain range towards 1 to 10. The solver found that the value of R1A=1.5274657297 k minimized the objective function. Whereupon I chose the 1% value of R1A=1.54 k. This produces a minimum gain of 1.1602797198 and a maximum gain of 11.653459153, close enough to a 1 to 10 ratio, and close enough to 1.2 to 12.

Figure 8:
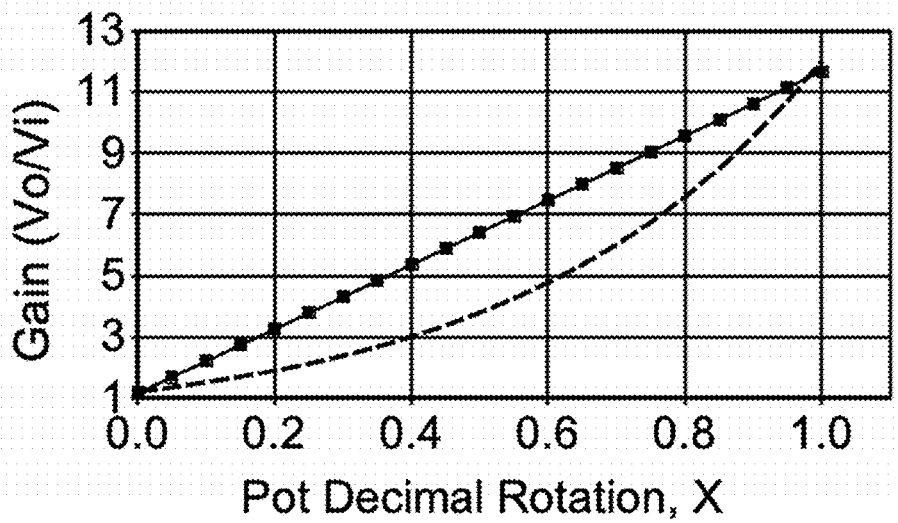
FIG. 8—The output gain curve of circuit A, gain versus pot rotation, as a solid line with data points on a linear-linear plot, with the Ideal log gain plot as a dashed line.
Figure 9:
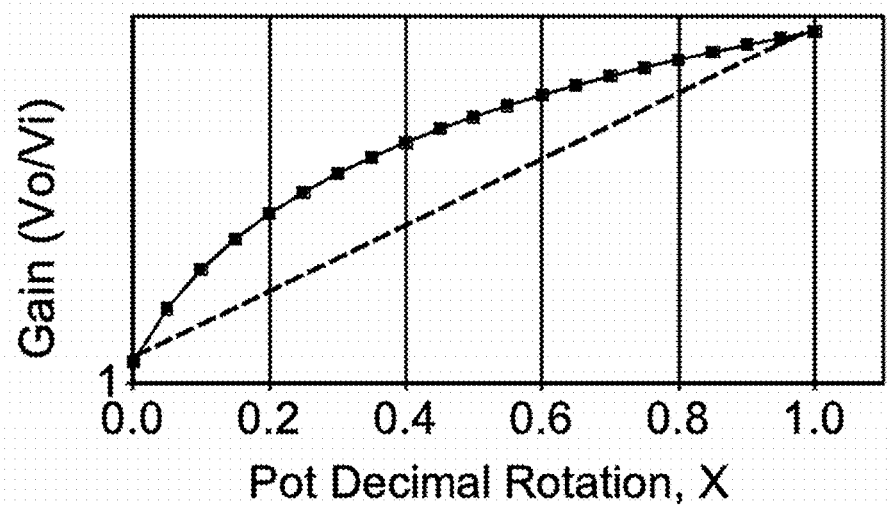
FIG. 9—The output gain curve of circuit A, gain versus pot rotation, as a solid line with data points on a semi-log plot, with the Ideal log gain plot as a dashed line.

FIG. 8 shows the gain characteristic (line with squares) for this circuit in a linear-linear plot, with the ideal plot as a dashed line. FIG. 9 shows the same curves in a log-linear (semi-log) plot. As Math 1 and FIG. 8 show, g is linear with x. In FIG. 9 this means that the volume increases, as audible to the human ear, faster with x at low gain that at high. But this gain curve is not unusable for this application. It's just not the most preferred. In the next circuits, we will see how this circuit can be modified with a third resistor to push g(x) more towards a semi-log curve.

Circuit B

Figure 10:
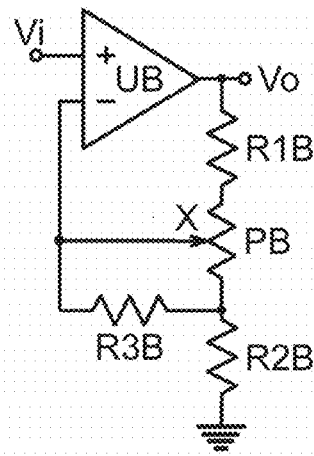
FIG. 10—A second embodiment, basic opamp circuit B, an ideal opamp, a pot, PB, and 3 resistors, R1B, R2B and R3B, producing a non-linear gain change with pot rotation, closer to ideal that circuit A, where a third resistor, R3B has been added to circuit A between the minus input of the opamp and to top of R2B.

FIG. 10 shows circuit B, a variation on circuit A, with all the previous components labeled with a suffix B. This circuit adds a third resistor, R3B, between the wiper and minus input of UB and the ungrounded end of R2B. Math 4 shows the gain equation:

$$g = \frac{Vo}{Vi} = \frac{(x^2 - x)PB^2 + (R1B + R2B)(x - 1)PB - R3B(PB + R1B + R)B2)}{(R2B + R3B)(x - 1)PB - R2B \cdot R3B} \quad \text{Math 4}$$

Because the gain characteristic curve is getting closer to the semi-log plot of the ideal curve in FIG. 5, we use a larger spreadsheet to solve and plot the results. Since R3B is added, the pot decimal rotation, x, is now in cells A14 to A34. The ideal_g column is now in B14 to B34. The numerator of Math 4 is in C14 to C34. The denominator of Math 4 is in D14 to D34. The gain g is in E14 to E34 and err is in F14 to F24. One makes the appropriate changes in the objective function in Math 3. A new column is added, log(g/ideal-g) in G14 to G34. To Math 3, we add a new term: +10000*(MIN(G14:G34)+MAX(G14:G34))^2. When the spreadsheet Solver too minimizes the objective function, this tends to force the result to produce equal minimum and maximum errors between g and ideal-g in the semi-log plot.

Figure 11:
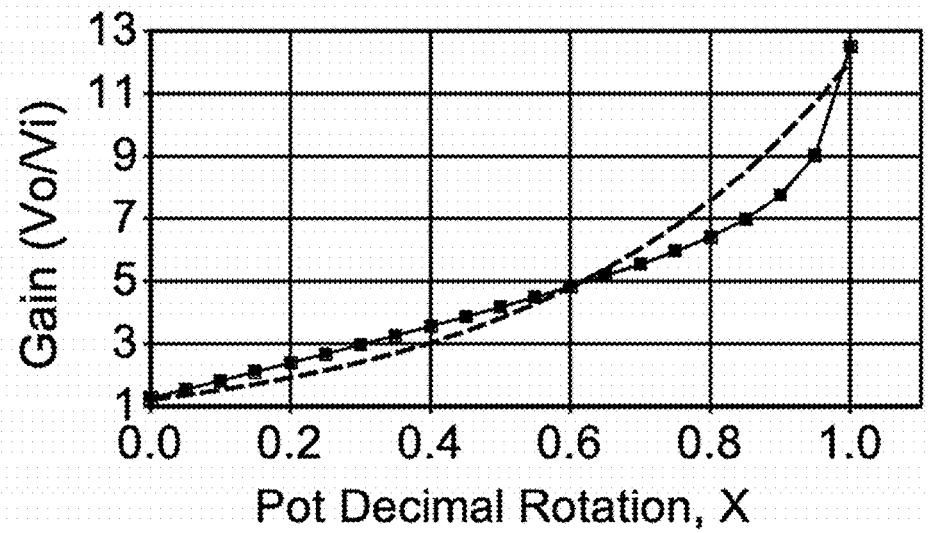
FIG. 11—The output gain curve of circuit B, gain versus pot rotation, as a solid line with data points on a linear-linear plot, with the Ideal log gain plot as a dashed line, where the values of resistors R1B, R2B and R3B have been optimized with a 100 k pot to produce a closer fit than circuit A of the opamp gain curve to the ideal gain curve.
Figure 12:
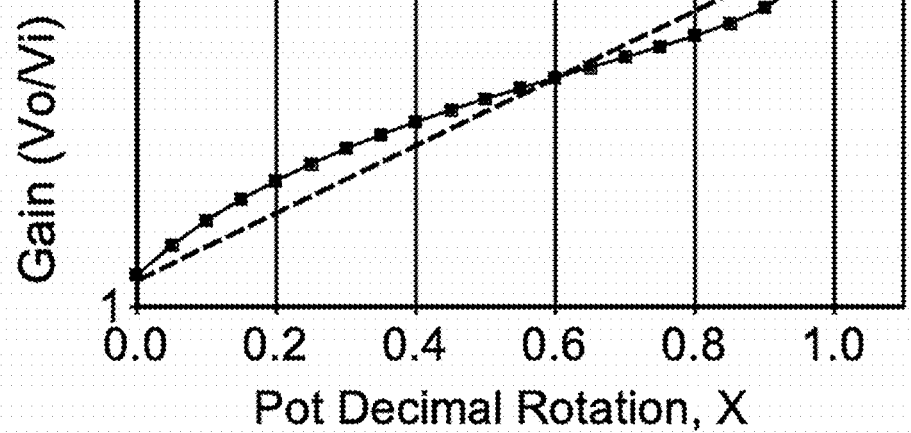
FIG. 12—The output gain curve in FIG. 11, plotted on a semi-log graph.

This time, the objective function came out to 13.31 with PB=100 k, R1B=4.3746 k, R2B=9.1210 k and R3B=9.7250 k. R3B=9.76 k was picked as the nearest 1% commercial resistor value, and then Solver varied the other two resistors. A 1% value of 9.09 k was picked for R2B, and then Solver varied R1B, for which a 1% value of 4.42 k was picked. This produced an objective function value of 13.36, and a gain range of 1.246 to 12.49. The log error is −0.0910 to +0.0961. So for circuit B, FIG. 11 shows the linear plot, and FIG. 12 shows the semi-log plot of the resulting gain function with a solid line and squares, with the ideal function as a dashed line. Note in FIG. 11 that the circuit B gain is almost linear until about x=0.8, beyond which it curves up sharply. But in FIG. 12, is moves about the ideal dashed line in a S-curve, with almost equal deviations above and below it.

Circuit C

FIG. 13 shows circuit C. Here, the resistor, R1C, compared to FIG. 10, is moved from between Vo and PC to between the minus input of UC and the wiper of PC. R3B and R3C are in the same position. Math 5 shows the gain equation:

$$g = \frac{Vo}{Vi} = \frac{(x^2 - x)PC^2 + (R2C \cdot x - R1C - R2C - R3C)PC - R2C(R1C + R3C)}{(x - 1)(R2C + R3C)PC - R2C(R1C + R3C)} \quad \text{Math 5}$$

The same objective function of Math 3 plus 10000*(MIN(G14:G34)+MAX(G14:G34))^2 is used. Using R1C to R3C, with PC=100 k, the spreadsheet solver finds R1C=7.3307 k, R2C=8.3845 k and R3C=14.822 k, with 9.7688 for the objective function value. After setting R1C to the 1% value of 7.32 k, the solver finds R2C=8.33863 k and R3C=14.8076. Setting R3C to the 1% value of 14.7 k, the solver finds R2C=8.3831. This in between two 1% values, so R2C=8.45 k is chosen, and the solver finds R1C=7.1318. So the 1% value of R1C=7.15 is chosen, giving the objective function a value of 9.9315, with a gain range of 1.286 to 12.83, and a log errors of min=−0.0785 and max=0.0795, slightly better than for circuit B. FIG. 14 shows the linear-linear plot of the gain curve, and FIG. 15 shows the semi-log plot of the gain curve. This time the gain curve is almost linear to about x=0.7, then rises more sharply. And the semi-log plot lies a bit closer to the ideal straight dashed line. Circuit C is slightly better than circuit B.

Circuit D

FIG. 16 shows circuit D. Here resistor R3B in FIG. 10 moves a connection from the upper end of R2B to the ground of R2B, to become R3D. Math 6 shows the gain equation:

$$g = \frac{Vo}{Vi} = \frac{(x^2 - x)PD^2 + ((R1D - R2D)x - R1D - R3D)PD - R1D \cdot R2D - R1D \cdot R3D - R2D \cdot R3D}{R3D((x - 1)PD - R2D)} \quad \text{Math 6}$$

Figure 18:
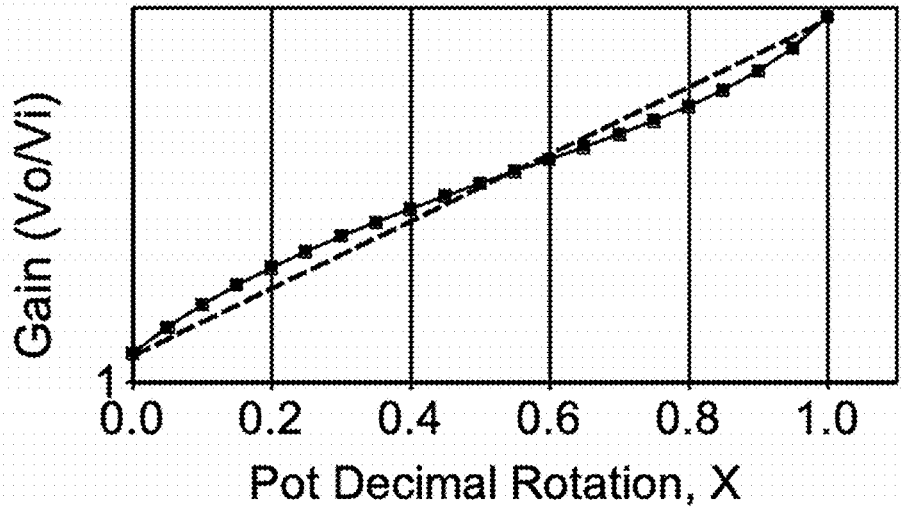
FIG. 18—The output gain curve in FIG. 17, plotted on a semi-log graph.

With PD=100 k, the spreadsheet solver finds the objective function (same as for Ciruicts B & C) to be 5.5321 for R1D=4.6477 k, R2D=14.5030 k and R3D=26.4487 k, with a gain range of 1.2163 to 12.172. Inserting 1% resistor values for one resistor at a time and successively recalculating using the solver tool, one finally ends up with R1D=4.87 k, R2D=14.3 k and R3D=26.7 k, with an objective function value of 5.5492, a gain range of 1.2250 to 12.2613, and log errors of min=−0.0580 and max=0.0623, better yet than the other three circuits. FIG. 17 shows the linear-linear plot of the gain curve and FIG. 18 shows the semi-log plot. Note that in FIG. 17 the pot is almost linear from x=to to about x=0.65, then rises more sharply. But in FIG. 18 it lies closer to the ideal (dashed) line that in FIGS. 9, 12 and 15. So circuit D is preferred over the others, and will presumably sound like a more even adjustment of amplitude than the others.

Circuit D with Switched Gains

Figure 19:
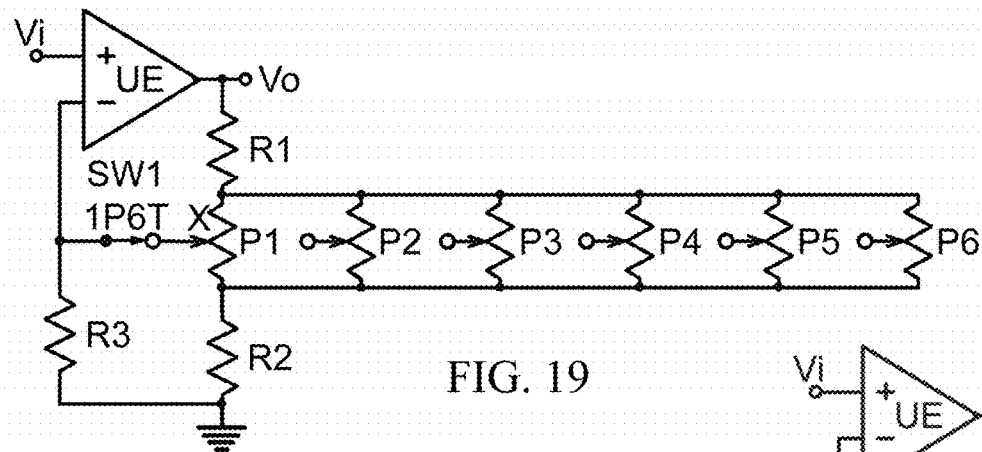
FIG. 19—An embodiment of circuit D, with an ideal opamp and three resistors, R1, R2 and R3, where the pot PD is replaced by P1, five more pots of equal value, P2 to P6, have been added, and a pole of a shorting (make before break) multi-throw switch, SW1, has been connected to the minus input of the opamp, with the throws connected to the wipers of pots P1 to P6, so that all are connected in parallel at their CCW and CW end terminals, but only one pot wiper is connected to R3 and the minus input of the opamp.
Figure 20:
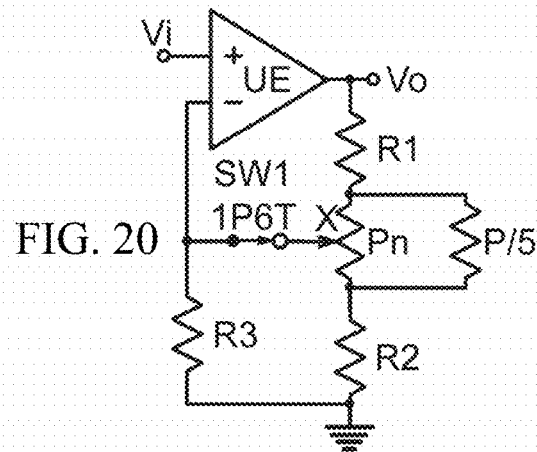
FIG. 20—The same circuit as FIG. 19, but where the pot, Pn, with the connected wiper is shown separately from the other pots, which pots are connected in paralled with Pn, and in this case have a resistance value of P/5, where Pn is also the resistance value of each pot.

FIG. 19 shows circuit D with a one-pole, 6-throw switch (SW1), and 5 more pots attached in parallel with the original pot, now labeled P1. The throws of the switch connect the circuit to the wipers of each pot. The opamp is now labeled UE, and the D-suffix has been dropped from the other components. FIG. 20 shows the equivalent circuit, where SW1 connects to the wiper of Pn, where n is 1 to 6, and the remaining five pots with disconnected wipers are combined into an equivalent resistor with a value of P/5. If each Pn is 100 k, then P/5 is 20 k.

Of course SW1 by itself isn't much use in a guitar preamp. Consider it to be, for example, the fourth and bottom pole of SW4 in FIG. 3, with the other three poles used to switch pickups. Fortunately for this application, most pickup switches have shorting contacts, meaning that that when the switch moves from one throw contact to the next, it temporarily connects the two throw contacts together. In this case, that tends to produce a temporary gain of somewhere between or below the two gains being switched. Otherwise, if it were a non-shorting switch, meaning that it disconnects from all the pot wipers between switch contacts, the gain would temporarily tend to shoot up to the maximum, or even a supply voltage rail, causing a large noise spike. This approach for switched gains will work with any of circuits A, B, C or D. It has been verified for B, C and D that the order of preference, based upon the logs of fitting errors, tends to remain the same. One also doubts that the preference order of circuit A would change.

Math 7

$$g = \frac{Vo}{Vi} = \frac{[(x^2 - x)P^2 + (5(R1 + R2)x^2 - (4R1 + 6R2)x - R1 - R3) - 6(R1 \cdot R2 + R1 \cdot R3 + R2 \cdot R3)]}{R3((x-1)P - 6R2)}$$

Figure 21:
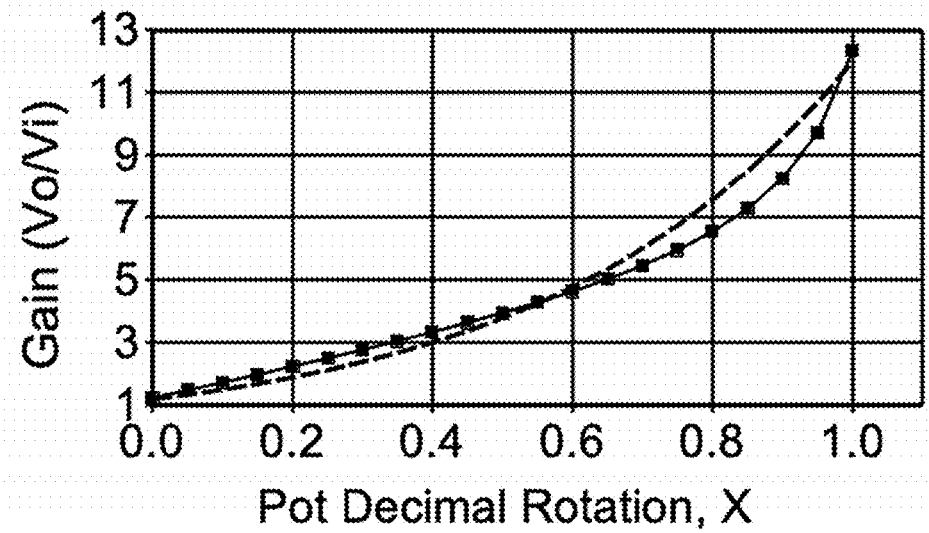
FIG. 21—The output gain curve of the circuit in FIGS. 19 & 20, gain versus pot rotation, as a solid line with data points on a linear-linear plot, with the Ideal log gain plot as a dashed line, where the values of resistors R1, R2 and R3 have been optimized with a 100 k pot to produce a close fit of the opamp gain curve to the ideal gain curve.
Figure 22:
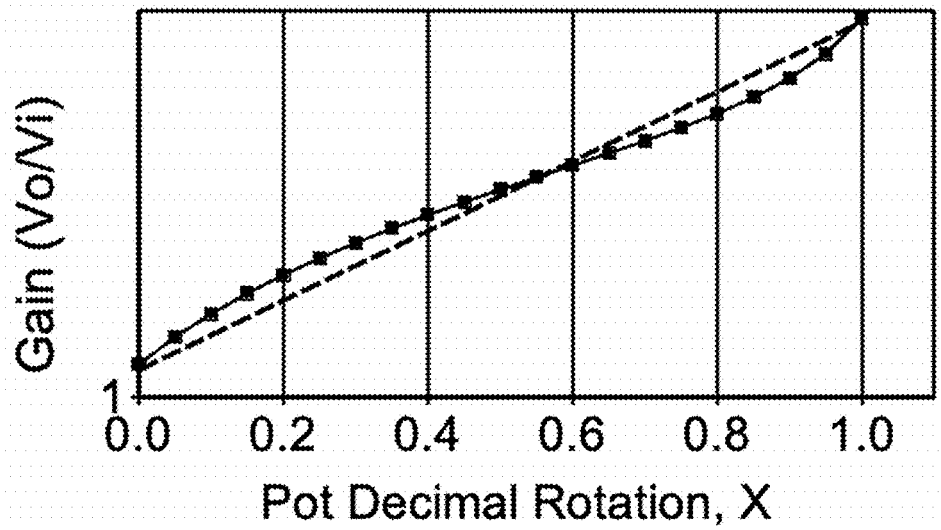
FIG. 22—The output gain curve in FIG. 21, plotted on a semi-log graph.

Math 7 shows the gain equation. The numerator is not a vector; it just won't fit on one line. After conducting the usual evolution, one gets R1=2.8 k, R2=1.82 k and R3=29.4 k, with P=100 k, the objective function=8.272, the min log err=−0.0667, and max log err=0.0731. FIG. 21 shows the linear-linear gain plot, and FIG. 22 shows the semi-log gain plot. However, a different objective function can get different results. A previous exercise produced R1=2.05 k, R2=1.78 k and R3=24.9 k. The objective function from this example for that exercise is 21.525, with a min log err= −0.0551 and max log err=0.0834. And I already bought those 1% resistors. Plotting the differences is an exercise left to the reader.

Some Considerations

This circuit can be used with any number of pots, two or more, and a switch with the same number of throws or less. Realistic numbers of pots and throws can be from 2 to 12. Say that a printed circuit board for this circuit has 6 pots and is used with a 4-throw pickup switch for two humbuckers, A and B, with switched signal outputs: A-B, A, A+B and B. Only 4 pots need to be used. The other 2 pots can be replaced by resistors of the same value as P; then there is nothing connected to the wiper contact. Any kind of pot can be used, but small 10 mm or ⅜ inch square, multi-turn pots are preferable. This circuit allows a guitarist either to compensate for pickup circuits with low outputs from phase cancellations, or to chose one or more pickup circuits for boosted outputs. Again, the preferable method of setting the gains initially is to set them all to minimum, then raise gains as necessary to match the weaker pickup circuit outputs to the loudest output. This tends to avoid output clipping issues when as or if the power supply voltage drops. For the opamp, low- or micro-power opamps with rail-to-rail voltage outputs are preferred. They tend to have minimum working power supply ranges of 1.4 or 2.7 volts, and a maximum of 5.5 volts. Some allow higher maximum supply voltages. But three AA cells or a 3.0 to 3.7 V lithium cell might be preferable, especially if the lithium cell is rechargeable from a 5 volt USB cable.

Circuit D with Switched Gains and a Mode Switch

FIG. 4 has a mode switch, SW16. In HB mode, it uses the pickup circuits switched by SW15 which are humbucking. In Hum mode, it shorts out the bottom pickup in the circuit, by shorting the common-point connection (triangle-C) to ground, allowing in external hum and leaving only the one or two pickups connected between the common-point connection and the output. The mode switch also switches the circuit ground between two sets of feedback resistors, which the bottom pole of SW15 connects to the minus input of U1 and its feedback resistor, $R_F$. Using a single pole like this won't work for circuits A, B, C or D, because one pot in the other mode will still be connected by two terminals (wiper and one side) to the circuit, throwing off the intended gain.

Figure 23:
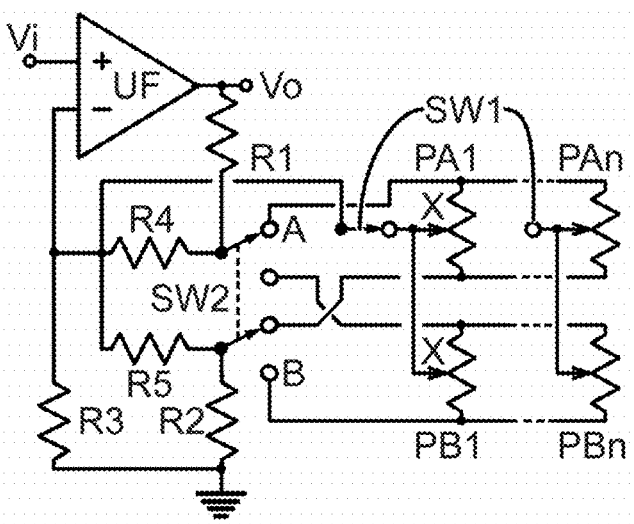
FIG. 23—A failed embodiment of the circuit in FIG. 19, where a 2-pole, 2-throw non-shorting (break before make) toggle mode switch has been added to accommodate two sets of potentiometers, PA1 to PAn, where n=1 or more, and PB1 to PBn, preferably all of the same resistance value, P, and resistors R4 and R5 have been added as shown in a failed attempt to reduce the switching spike of the mode switch.

FIG. 23 shows circuit D with a 2-pole, 2-throw mode switch, SW2. This particular switch is a common break-before-make, non-shorting toggle switch. Resistors R4 and R5 have been added to provide a feedback path while the switch is moving between contacts. Otherwise, the gain will shoot up to a very large value and cause a loud snap in the output. But the addition of these resistors makes the gain equation very complicated, requiring 7 columns in a spreadsheet to deal with all the terms in the numerator and denominator (not presented here). They also make the optimization of the circuit, to obtain the gain curve, very difficult, if not impossible. Therefore, this circuit is not preferred, and not claimed.

Figure 24:
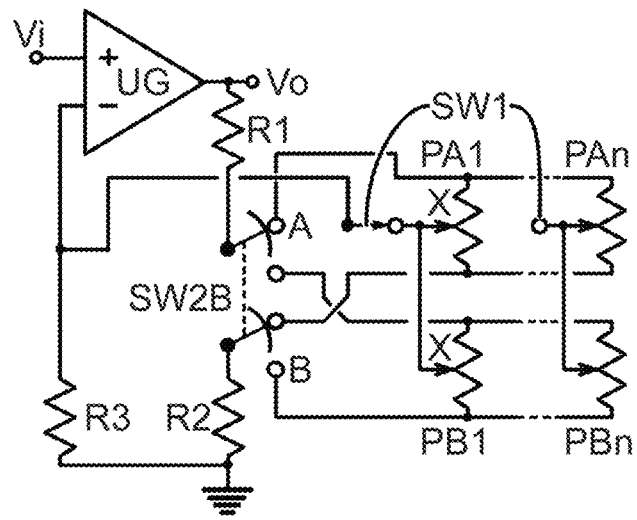
FIG. 24—An embodiment of the circuit in FIG. 19, where a 2-pole, 2-throw shorting mode switch has been added to accommodate two sets of potentiometers, PA1 to PAn, where n=1 or more, and PB1 to PBn, preferably all of the same resistance value, P.

FIG. 24 shows the preferred and claimed version, with a shorting mode switch, SW2B, with modes A and B, which shorts the throw contacts together before finishing the switch from one mode to the other. Instead of causing a high-gain noise spike, this will tend to drop the gain temporarily. Here, the throws of SW1 are connected to two different sets of gain potentiometers, PAj, and PBj, where j=1 to n, n being the number of throws in SW1. SW2B switches between mode A, in which the PAj pots are active in the circuit, and mode B, in which the PBj pots are active. With a third pole and set of throws, the mode switch, SW2B, can serve a similar function as SW16 in FIG. 4, where on one pole the Hum mode shorts the common-point pickup connection (triangle-C) to ground, and the humbucking (HB) mode does not. Note the throws of SW1 are connected to the wipers of both the A and B sets of pots. But the mode switch disconnects the other two terminals of one set, so that it cannot be active in the circuit. If necessary for some appropriate application, it is also possible for SW2B to have more than 2 throws, and the circuit to have more than 2 sets of pots. Nor are pots the only type of component that can be switched.

An Experimental Circuit D

Figure 25:
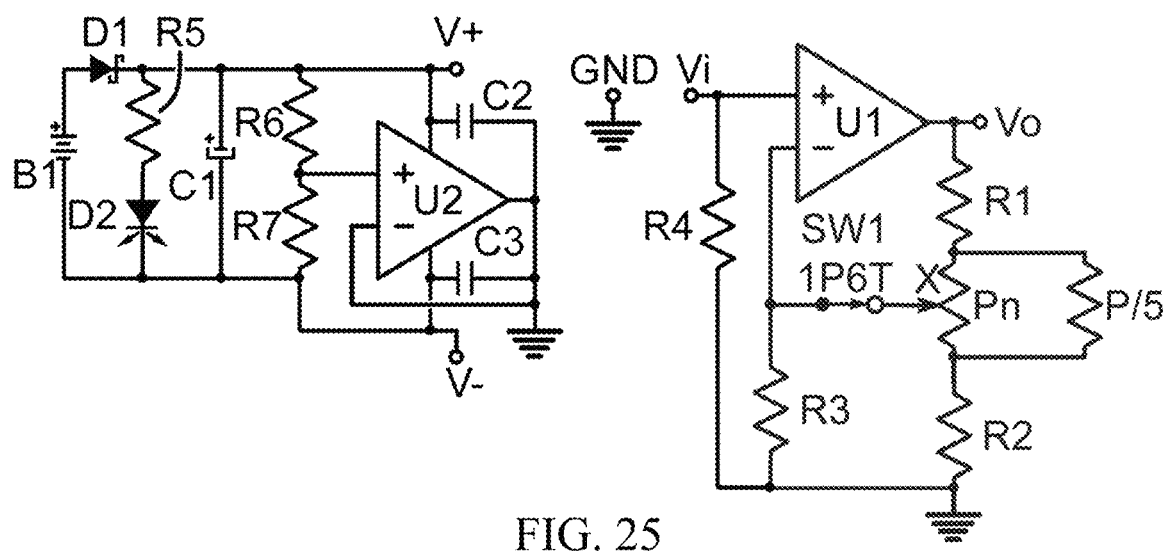
FIG. 25—An experimental version of the circuit in FIG. 20, created on a plastic plug board, including a version of the battery-splitting circuit from FIG. 1, using the two opamps of a Microchip Technology MCP6002 dual opamp 8-pin DIP device, and a 26.5-turn, ⅜-inch square, 100 k trimming potentiometer.

FIG. 25 shows the circuit in FIG. 20 which was set up on a plastic breadboard, with a battery power supply like that in FIG. 1 using U5. Here, FIG. 20 was modified and reproduced to the right of the power supply. Here is a list of the components:

a. B1—2 1.5V alkaline cells
b. D1—1N5817 Schottky rectifier
c. R5—10 k 10% carbon film resistor
d. D2—small red LED
e. C1—100 uF, 25 V electrolytic capacitor
f. R6, R7—100 k 10% carbon film resistors
g. U1, U2—operational amplifiers on a Microchip Technology MCP6002 Dip dual amplifier
h. C1, C2—ceramic 0.1 uF capacitors
i. R4—2.2M 10% carbon film resistor
j. R1—2.00 k 1% metal film resistor
k. R2—1.78 k 1% metal film resistor
I. R3—24.9 k 1% metal film resistor
m. SW1—just a wire jumper
n. Pn—100 k linear ⅜-inch square multi-turn trimmer pot, Bourns PV36Y104C01B00
o. P/5—two 10 k 10% carbon film resistors in series Together the batteries put out about 2.97V, unloaded. When connected to the circuit, the drop across the polarity-protection diode, D1, is about 166 mV, and the current drain is about 0.34 mA. When the LED, D2, is removed, the current drain is about 0.24 mA. V+ is about 1.410V and V− is about −1.408V. Since the MCP6002 opamp chip has rail-to-rail input and output limits, clipping of the output signal started at about 2.8V peak-to-peak (2.8 Vpp). The MCP6002 has a specified supply voltage range of 1.8V to 5.5V. For 2 AA cells, this means that the voltages on the cells can drop to about 0.983V each before it ceases to function, where it will clip the output signal above 1.8 Vpp. For 3 AA cells, the output clipping for maximum battery voltage and output signal will be about 4.5V-0.2 V=4.3 Vpp, and the cell voltages can drop to about 0.66V each, before the preamp ceases to function. Then the maximum output voltage will be about 1.98 Vpp before clipping.

One test of the preamp put a signal of about 1000 Hz into the input with the same 2 AA battery pack, at a level which just started to produce clipping at the output, which was driving a 220 k resistor, simulating a volume control pot. The current drain for the preamp was about 0.40 mA. An Energizer E91 AA alkaline battery is rated for about 2800 mAh (milliamp-hours) at 25 mA continuous discharge to 0.8 V at 21 deg-C. That should mean a 3 cell pack will last about 8235 hours simply turned on with no input or output signal for this amplifier circuit, and about 7000 hours with an output level of 2.8 Vpp. That might be optimistic, but getting 1000 to 2000 hours of continuous operation out of 2 or 3 AA batteries should be realistic. It would require more testing to get a more definitive answer.

Primary (non-rechargeable) and rechargeable Lithium-ion cells are also good alternatives. AA Li-ion cells that are individually rechargeable with USB cables run from 1700 to 2000 mAh, and should drive the preamp about 1700 to 2000 hours. Single CR123a primary Li-ion cells vary from about 3.1 V with an end-stage of about 2.0V, and 1300 to 1500 mAh. Rechargeable 16340 or RCR123a Li-ion cells charge to about 4.2V, with a nominal voltage of 3.7V, and discharge to about 2.7V, with capacities of 700 to 800 mAh. Recall that 40 hours a week for 52 weeks a year is 2080 hours. And 24 hours a day for 31 days is 744 hours. At supply voltages higher than the 3V of the experimental test here, the quiescent and working battery drains might be higher, but anything over 400 hours of run time, or about 16.7 days, is much better than cell phones.

Figure 26:
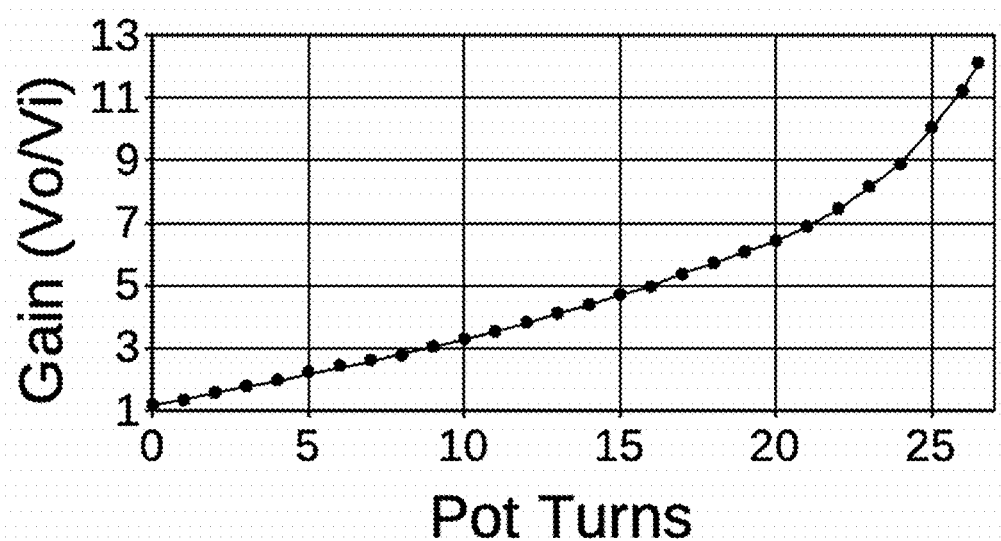
FIG. 26—The linear-linear plot of the gain of the preamp in FIG. 15 versus pot turns, with the solid line from using a DC input, and the dots from an AC input.
Figure 27:
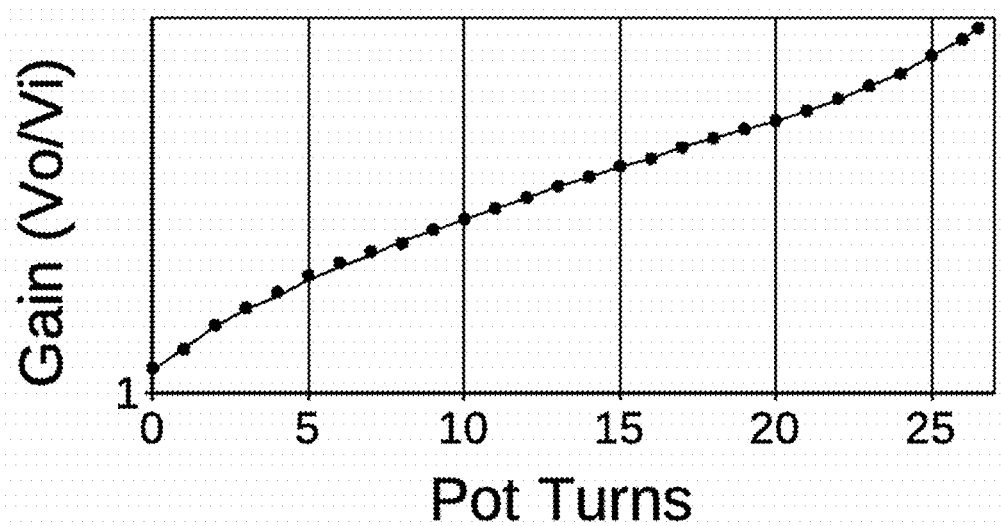
FIG. 27—The semi-log plot of the data in FIG. 26.

A DC voltage source was created between the input Vi in FIG. 25 and ground by connecting a 1N5817 diode across 2.2M grounding resistor, R4, and driving a forward voltage of 0.1083V on the diode with a 27 k biasing resistor from Vi to V+. The DC output voltage, Vo, was measured with a Circuitmate DM25 digital multimeter as the adjustment screw of the multi-turn trimmer pot, Pn, was rotated 1 turn at a time, until it hit the upper limit at about 26.5 turns. In the next experiment, an AC voltage source was created by connecting a Simpson 470 function generator between Vi and ground, set to about 1 kHz at 99.7 mVAC on the DM25, and the same measurement process was repeated, using the DM25 to measure AC voltage at Vo. FIG. 26 shows the linear-linear plot of circuit gain, Vo/Vi, for turns 0 to 26.5. The solid line is the DC gain, at 1.174 to 12.09, and the dots are the AC gain, at 1.190 to 12.14. FIG. 27 shows the semi-log plot of the same data. The lines are a bit wobbly because the turns were eyeballed and not precisely 360 degrees each. Nevertheless, the semi-log plot is adequately close to a straight line for these purposes.

Circuit A, B, C or D with a Digital Pot

Figure 28:
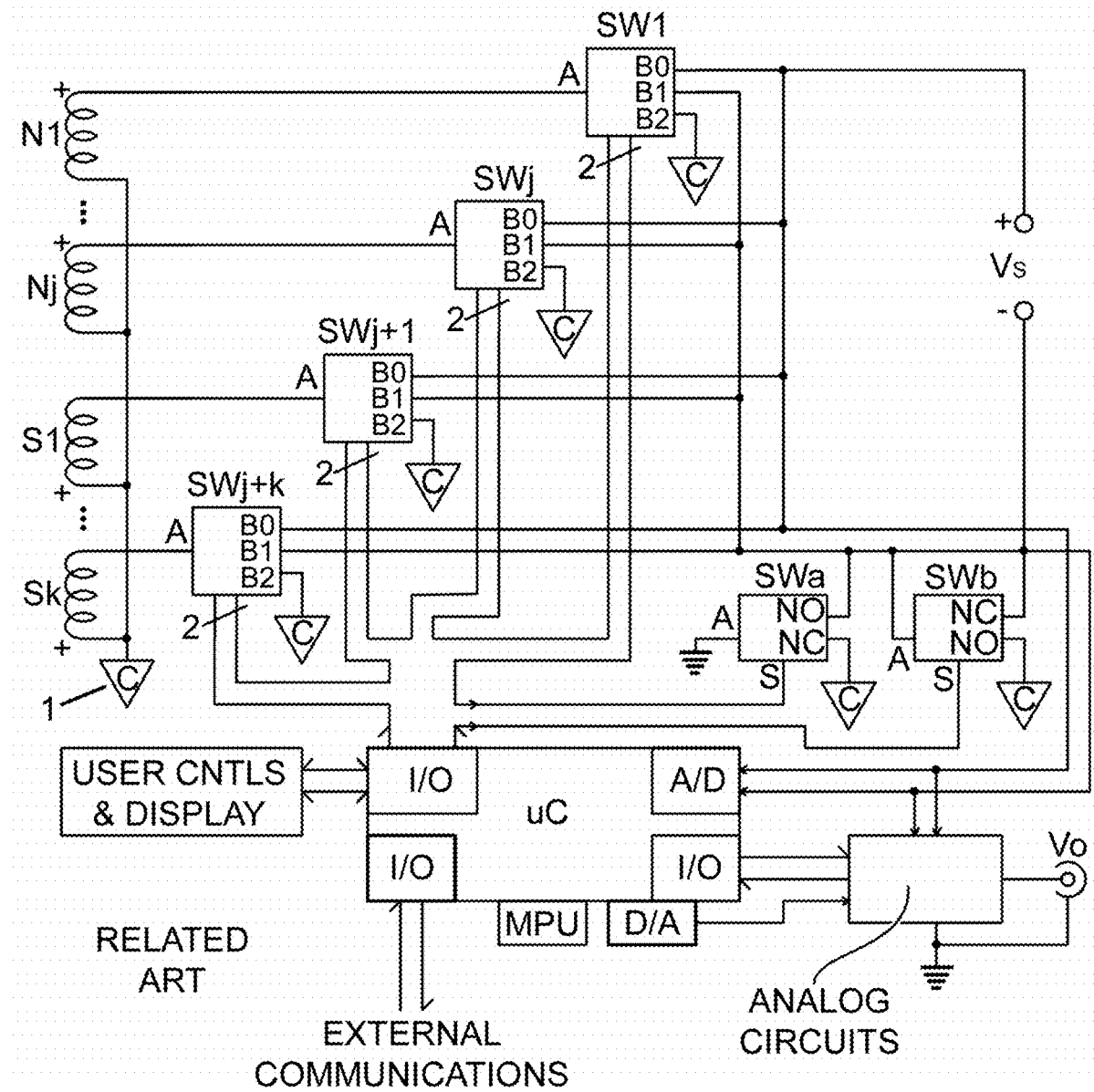
FIG. 28—Shows a pickup switching system with an analog path and digital control from FIG. 16, U.S. Pat. No. 10,380,986 (Baker, 2019).
Figure 29:
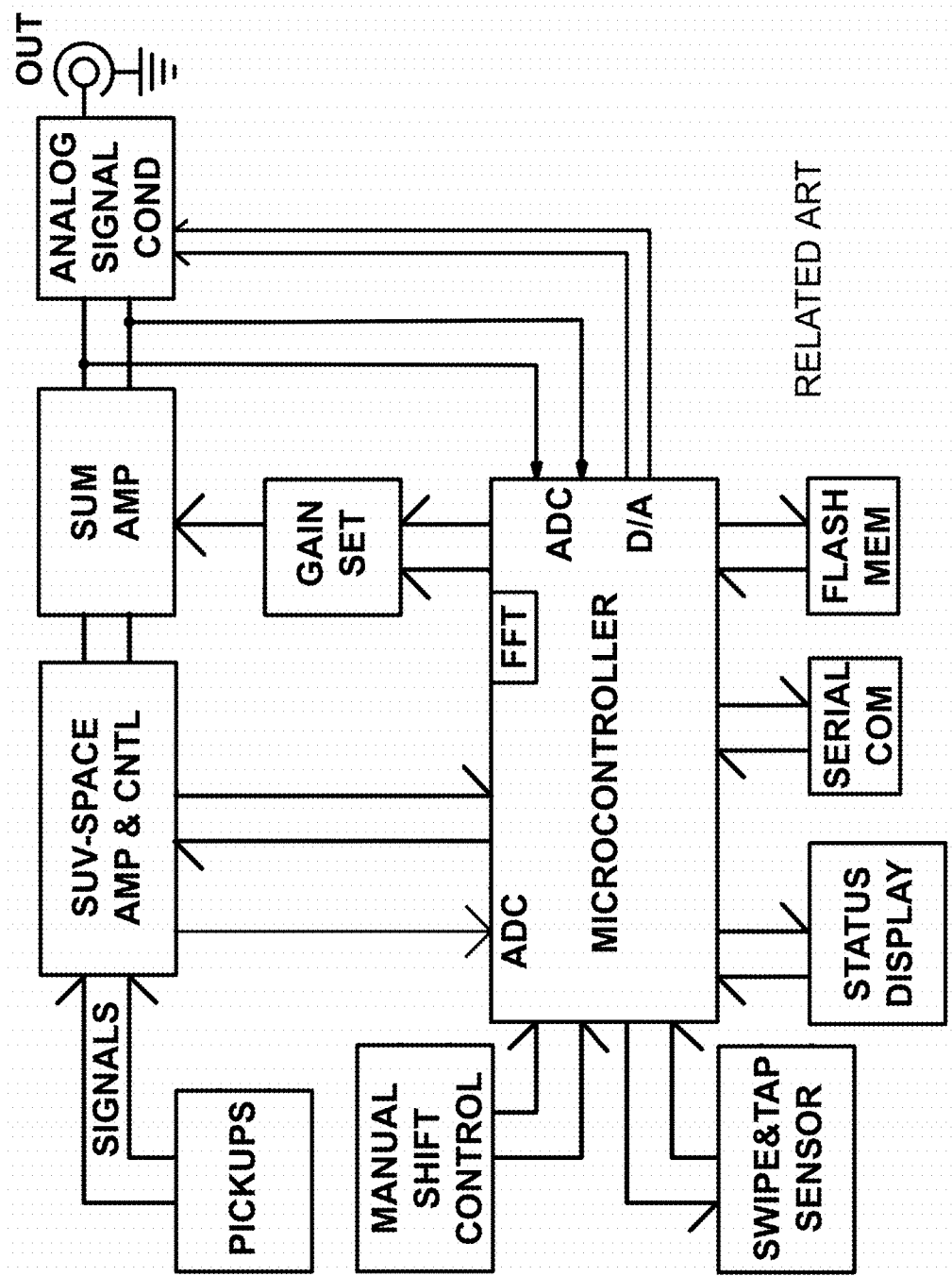
FIG. 29—Shows a pickup combining system from FIG. 21, U.S. Pat. No. 11,087,731 (Baker, 2021).

There are a number of linear digital pots which may be suitable to replace pots PA, PB, PC or PD in the basic circuits in FIGS. 7, 10, 13 and 16. They include the Analog Devices AD5121/AD5141, the Microchip Technologies MCP413X/415X/423X/425X, MCP453X/455X/463X/465X and MCP454X/456X/464X/466X, and the ON Semiconductor CAT5140 (depending on the power supply). All of them have a 100 k-ohm option. Using a digital pot can eliminate the need for the pot selection and mode switches, greatly simplifying the circuit. FIG. 28 shows a pickup switching system with an analog path and digital control from U.S. Pat. No. 10,380,986 (Baker, 2019). FIG. 29 shows a pickup combining system from U.S. Pat. No. 11,087,731 (Baker, 2021). In both systems, a low-power digital microcontroller or micro-processor controls the analog signal path, including the analog signal gain. It would set the gain in software separately for each choice of the musician of pickup circuit or signal combination, instead of using mechanical switches. The semi-log preamp with a digital pot would fit in the "analog circuits" box in FIG. 28 and be part of the combination of the "gain set", "sum amp" and "analog signal cond" boxes of FIG. 29. The object of these two systems: to allow the musician to pick favorite tones/timbres out of a wide array, and program them to a favorite order, with a desired output amplitude for each one. Not entirely unlike setting up an old car radio with channel selection push-buttons.

The ON Semiconductor CAT5116 digital pot has a log-taper, but one could not find a way to make it work in an opamp feedback circuit based on the output and minus opamp input, using the embodiment circuits A, B, C or D. It would work in a feedback circuit based on the output and the plus opamp input, placed between the output and plus input, but it has a total resistance of only 32 k. To get a gain range of 1 to 10 would require that a resistor of 3.2 k between the signal voltage and the plus input. Since this is lower than the resistance of many pickup coils, it would require an additional isolating opamp between a pickup circuit and the gain opamp to avoid loading the pickups. The 3.2 k resistor would also require more drive current from the preceeding stage, further draining any battery supply, which is missing in FIG. 9, U.S. Pat. No. 11,011,146 (Baker, 2021). This approach, however, might be feasible for the invention in U.S. Pat. No. 11,087,731.

Also the ON CAT5116 and CAT5140 have an operation power supply range of 2.7V to 5.5V for specified characteristics, and a minimum supply of 2.5V for the full operating range. This may limit the practical battery supply either to a 3.7V Lithium-ion cell with some reduction in run time, or to 3 AA alkaline cells, where the individual cell could be allowed to drop to about 0.9V at end of life. A set of 3 or 4 NiMH 1.2V rechargeable cells could be used, with changes in the run time, and some impositions of signal clipping with battery drain. This could be overcome by setting the switched gains lower to avoid clipping, which applies to multi-turn trimmer pots as well.

Preamp Bypass Switch and Jack Switch

Figure 30:
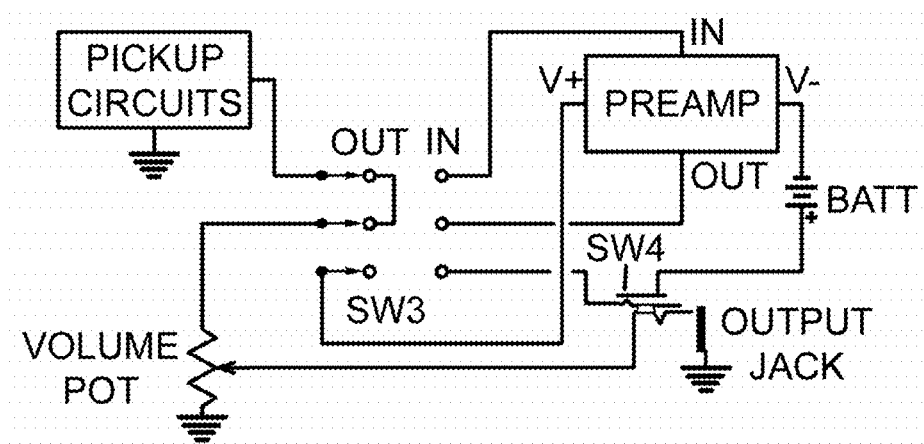
FIG. 30—Shows the preamp bypass switch, SW3, and the output jack battery cutoff switch, SW4.

FIG. 30 shows the 3-pole, 2-throw preamp bypass switch, SW3, with IN and OUT states. In the OUT SW3 state, the pickup circuit outputs go directly to the master volume pot, and the V+ of the battery, BATT, is disconnected from the preamp. In the IN SW3 state, the pickup circuit outputs go to the input of the preamp, and the output of the preamp goes to the master volume pot. In both SW3 states, the wiper of the master volume pot goes to the OUTPUT JACK. The output jack also contains SW4, which does not make a shorting contact until the output plug is inserted. This also disconnects the battery from the preamp if the output plug is pulled. SW3 allows the guitar to have an output and be played into an amplifier if the preamp fails. SW4 cuts the battery drain when there is no output cable inserted into the guitar output jack. This kind of circuit is fairly common in guitar distortion pedals.

I hereby claim:

1. A preamplifier, or preamp, comprising of a number of electronic components, including:
   a. a power supply circuit, preferably battery-powered with the voltage evenly split about the system ground into plus and minus supply voltages, preferably with circuits disconnecting the primary power, such as one or more batteries, from the rest of the circuit when the preamp is not in use; and
   b. a differential operational amplifier, or opamp, preferably a linear integrated circuit, preferably a micro- or low-power single or dual-opamp with a quiescent supply drain of 1 milli-amp (mA), or less, the first of the opamps being dedicated to a variable-gain preamp circuit, and if such power supply is not simply two battery cells with a center-tapped system ground between them, the second of the two opamps being dedicated to the power supply; and
   c. a variable-gain feedback circuit connected to the first opamp, which sets the gain of the preamp, preferably connected between the minus input of the first opamp and its output, with the plus input of the first opamp being dedicated to the input signal, this feedback circuit having at least four embodiments of slightly different circuit connections, each of which approximates increasingly closely an ideal semi-log gain characteristic in which the log of the gain is proportional to the linear change in feedback control, but at any gain set by circuit, the amplified signal response is still linear; and
   d. two or more fixed resistors, preferably 1% or better tolerance, used and connected in the feedback circuit; and
   e. one or more gain-control potentiometers, or pots, used and connected in the feedback circuit as gain controls, either analog or digital, preferably all with the same total resistance value, preferably multi-turn, grouped in k sets of n number of pots, where k is 1 or more and n is 1 or more, each of the number n pots in a single k group being connected in parallel with each other with all the CCW terminals at a first connection and all the CW terminals at a second connection of the parallel circuit, with the pot wipers not being connected to either of these first or second parallel connections, so that there are k groups of n parallel pots; and
   f. a mode switch of 2 poles and k throws, preferably make-before-break (shorting), which throws connects one of the k groups of n pots to the feedback circuit by their outer CCW and CW terminals without connecting to the pot wipers; and
   g. a pot selection switch of 1 pole and m number of throws, preferably shorting, part of an m-throw switch with 1 or more poles, preferably where m equals n, the m number of throws preferably equaling the number of n pots in each of the k groups of pots, in which each throw connects in order to the wiper of just one pot in each of the k groups, meaning that each throw connects to the wipers of k pots, with each of the pots being in a separate group of k pots, the order of the throws 1 to m or 1 to n being the same as the order of positions of the 1 to n pots in each k group, wherein the pole of the pot selection switch connects k and only k wipers of the pots to the feedback circuit, such that while n pots may be connected in parallel in the feedback circuit and the wipers of k pots may be connected to the feedback circuit, one and one pot only can control the variability of the gain of the circuit.

2. The preamplifier as recited in claim 1, having a first basic embodiment called circuit A, comprising of the first opamp with a first resistor, R1A, connected between the output of the first opamp and preferably the CCW terminal of a gain-control pot, PA, the wiper of the pot PA being connected to the minus input of the first opamp, the other terminal of PA and a terminal of a second resistor, R2A, the other terminal of R2A being connected to ground, the additional pots, and mode and pot selection switches being either combined into PA as an equivalent circuit or simply not considered.

3. The preamplifier as recited in claim 1, having a second basic embodiment called circuit B, comprising of the first opamp, with a first resistor, R1B, connected between the output of the first preamp and preferably the CCW of a gain-control pot, PB, the other terminal of PB being connected to one terminal of a second resistor, R2B, the other terminal of R2B being connected to ground, and a one terminal of a third resistor, R3B, being connected to the wiper of PB and the minus input of the first opamp, with the other terminal of R3B being connected to the connection of PB and R2B, the additional pots, and mode and pot selection switches being either combined into PA as an equivalent circuit or simply not considered.

4. The preamplifier as recited in claim 1, having a second basic embodiment called circuit C, comprising of the first opamp, with a terminal of a gain-control pot, PC, preferably the CCW terminal of PC, being connected to the output of the first opamp, with a first resistor, R1C, connected between the minus input of the first opamp and the wiper of PC, a second resistor, R2C, connected by one terminal to the other terminal of PC, preferably the CW terminal of PC, and by the other terminal to ground, and a third resistor, R3C, connected between the minus input of the first opamp and the connection between PC and R2C, the additional pots, and mode and pot selection switches being either combined into PA as an equivalent circuit or simply not considered.

5. The preamplifier as recited in claim 1, having a fourth basic embodiment called circuit D, being the preferred basic embodiment, comprising of the first opamp, with a first resistor, R1D, connected between the output of the first opamp and a terminal of a gain-control pot, PD, preferably the CCW terminal, the wiper of PD being connected to the minus input of the first opamp, the other terminal of PD, preferably the CW terminal, being connected to one terminal of a second resistor, R2D, the other terminal of R2D being connected to ground, with a third resistor, R3D, connected between the minus input of the first opamp and ground, the additional pots, and mode and pot selection switches being either combined into PA as an equivalent circuit or simply not considered.

6. The preamplifier as recited in claim 1, in which k=1, meaning that there is only group of n gain-control pots, and the mode switch is not present to switch between groups.

7. The preamplifier as recited in claim 1, in which n=1, meaning that there are only k single pots, with all their wipers connected to the same point in the feedback circuit, but with their other terminals switch into the circuit with the 2-pole selection switch.

8. The preamplifier as recited in claim 1, in which n=1 and k=1, meaning that there is only one control pot.

9. The preamplifier as recited in claim 1, in which the number of throws, m, of the selection switch is less than n, and where the pots which would then not have wipers connected to the feedback circuit by the selection switch are replaced with resistors of the same total value as individual pots, at the positions of the CCW and CW terminals of the missing pots.

10. The preamplifier as recited in claim 1, in which one or both of the mode and selection switches are digitally-controlled analog switches, with switching times short enough that any noise spikes will not be significant in the amplified analog signals.

11. The preamplifier as recited in claim 1, comprising of components mounted on a printed circuit board, either as surface mount devices, through-hole pin devices, or any combination thereof.

12. The preamplifier as recited in claim 11, wherein any component may be mounted off the printed circuit board and connected to the circuit board by wires and connectors.

13. The preamplifier as recited in claim 1, wherein the use of a digital gain-control pot, itself controlled by software in digital processors from outside the preamplifier, eliminates the need for pot-selection and mode switches, and additional parallel pots, which switches and parallel pots need not be present in or associated with or connected to the preamplifier.

* * * * *